United States Patent [19]
Deem

[11] Patent Number: 4,893,266
[45] Date of Patent: Jan. 9, 1990

[54] ALIAS TAGGING TIME DOMAIN TO FREQUENCY DOMAIN SIGNAL CONVERTER

[75] Inventor: Jake O. Deem, Scottsdale, Ariz.

[73] Assignee: Motorola, Inc., Schaumburg, Ill.

[21] Appl. No.: 284,777

[22] Filed: Dec. 12, 1988

Related U.S. Application Data

[63] Continuation of Ser. No. 56,617, Jun. 1, 1987, abandoned.

[51] Int. Cl.$^4$ ............................................. G06F 15/353
[52] U.S. Cl. ..................................... 364/726; 364/484
[58] Field of Search ............... 364/726, 485, 576, 484; 324/77 B; 328/133

[56] References Cited

U.S. PATENT DOCUMENTS 4,601,005  7/1986  Kilvington ........................... 364/602
4,730,257  3/1988  Szeto .................................... 364/484

OTHER PUBLICATIONS

Oppenheim et al., "Digital Signal Processing", Prentice-Hall, 1975, pp. 284–336.

Primary Examiner—David L. Clark
Assistant Examiner—Tan V. Mai
Attorney, Agent, or Firm—Frank J. Bogacz

[57] ABSTRACT

A signal converter which inputs a time domain signal having a relatively large bandwidth and which outputs a frequency domain signal is disclosed. The time domain input signal is split into two identical portions. One portion is delayed relative to the other portion to produce an unambiguous relative phase shift which varies as a function of frequency. The two portions are sampled at a rate which is significantly below the Nyquist rate for the bandwidth. Two conventional discrete Fourier transforms (DFT) processors transform the two portions into two frequency domain data arrays. A post-DFT operation resolves the relative phase differences to expand the bandwidth which results from the low sampling rate and to eliminate aliasing.

11 Claims, 2 Drawing Sheets

ALIAS TAGGING TIME DOMAIN TO FREQUENCY DOMAIN SIGNAL CONVERTER

This application is a continuation of prior application Ser. No. 056,617, filed June 1, 1987, now abandoned.

BACKGROUND OF THE INVENTION

This invention generally concerns time domain to frequency domain signal converters. Specifically, the present invention relates to such signal converters which convert a relatively large bandwidth time domain input signal. More specifically, the present invention relates to such signal converters which sample the time domain input signal at a rate which is less than the Nyquist rate for the selected bandwidth. Alternatively, the present invention relates to such signal converters which increase frequency cell resolution over that achievable with a given number of input data samples.

Conventional time domain to frequency domain signal converters are well-known in the art. Many conventional signal processors, computers, and MSI logic circuits are capable of performing discrete fourier transformations. A discrete fourier transform (DFT) processor represents one form of a time domain to frequency domain signal converter. Such devices typically convert a time domain signal that represents a combination of one or more frequency components each of which exhibits an indeterminate frequency within a predetermined frequency band and each of which exhibits an indeterminate amplitude within a predetermined amplitude range. They typically output a signal which provides frequency domain information. The frequency domain information typically takes the form of a data array having amplitude information associated with each of a plurality of frequency cells. Thus, the time domain input signals' frequency components will be transformed into appropriate frequency cells. However, conventional systems which utilize DFT processors suffer limitations due to design constraints imposed by the DFT processors.

For example, DFT processors typically require an input data array obtained from sampling an input signal. The rate of sampling the input signal dictates the input frequency bandwidth which is transformed by the DFT processor. The Nyquist sampling rate, which is defined as being two samples for each complete oscillation of the maximum frequency of an input signal, defines a theoretical maximum bandwidth. Furthermore, the number of samples in an input data array dictates the frequency resolution of the DFT processor output.

Conventional systems which use DFT processors either suffer a limited bandwidth or utilize multiple DFT processors operating in parallel to address the bandwidth problems caused by sampling at slow rates. When multiple DFT processors operate in parallel, each operates over its own unique subband portion of a larger input frequency band. The use of multiple DFT processors causes the expense and complication of multiple DFT processors operating in parallel in addition to circuit complexity and expense connected with resolving ambiguities which occur through overlaps or gaps between the subbands.

In addition, a usually undesirable phenomenon called aliasing occurs when the input time domain signal contains frequency components either above or below the bandwidth for which the DFT processor is designed to operate. One conventional approach to the aliasing problem is to increase the sampling rate for the DFT processor above the theoretical minimum Nyquist sampling rate. However, as an undesirable consequence of this increased sampling rate, the system bandwidth achievable at a given sample rate decreases.

Another approach to the aliasing problem incorporates a sharp cutoff filter prior to the DFT processor to limit the influence of frequency components beyond the input frequency band. However, practical filters cannot achieve a sharp enough cutoff to completely solve the aliasing problem. Resultingly, typical systems which employ DFT processors use a combination of input filtering and increased sampling rates to address aliasing.

SUMMARY OF THE INVENTION

Accordingly, it is an object of the present invention to provide an improved time domain to frequency domain signal converter.

Another object of the present invention concerns providing an improved time domain to frequency domain signal converter which permits sampling below the Nyquist rate for a given system bandwidth.

Yet another object of the present invention concerns providing an improved time domain to frequency domain signal converter which utilizes conventional discrete fourier transform processors.

Still another object of the present invention concerns providing an improved time domain to frequency domain signal converter which expands an input signal's frequency band over that achievable at a given sampling rate using a single conventional discrete fourier transform processor.

Another object of the present invention concerns providing an improved time domain to frequency domain signal converter which increases frequency cell resolution over that achievable using a single discrete fourier transform processor operating on an input data array having a given number of samples.

The above and other objects and advantages of the present invention are carried out in one form by a time domain to frequency domain signal converter which includes first and second conventional discrete fourier transform processors. An input signal is routed directly to the first fourier transform processor and to an element which provides a signal delay. The output of this delay element represents a delayed input signal and is routed to an input of the second fourier transform processor. Outputs from the first and second fourier transform processors couple to a device which calculates relative phase difference between the input signal and the delayed input signal.

BRIEF DESCRIPTION OF THE DRAWINGS

A more complete understanding of the present invention may be derived by reference to the detailed description and claims when considered in connection with the accompanying drawings, wherein like reference numbers indicate similar features, and wherein;

DETAILED DESCRIPTION OF THE PREFERRED EMBODIMENT

The present invention receives an input signal which consists of one or more indeterminate frequency components. Each of the frequency components may exhibit a unique amplitude. This input represents a time domain signal. The present invention seeks to determine the approximate frequencies and magnitudes of the most significant ones of these frequency components. Thus, the present invention outputs a frequency domain signal which contains information describing specific frequency cells and specific signal amplitudes of the frequency components associated with the frequency cells. Furthermore, the present invention seeks to transform the input time domain signal into the output frequency domain signal for input signals covering a relatively large bandwidth.

The present invention divides the input signal into two portions. Then, the present invention delays one of the two portions relative to the other. The two portions are substantially identical except for the delay of one portion with respect to the other. The delay represents a constant period of time regardless of input signal characteristics, such as input signal frequency. Consequently, the delayed portion of the input signal exhibits a phase change relative to the non-delayed portion, and the amount of phase change varies as a linear function of frequency of the input signal.

Figure 1:
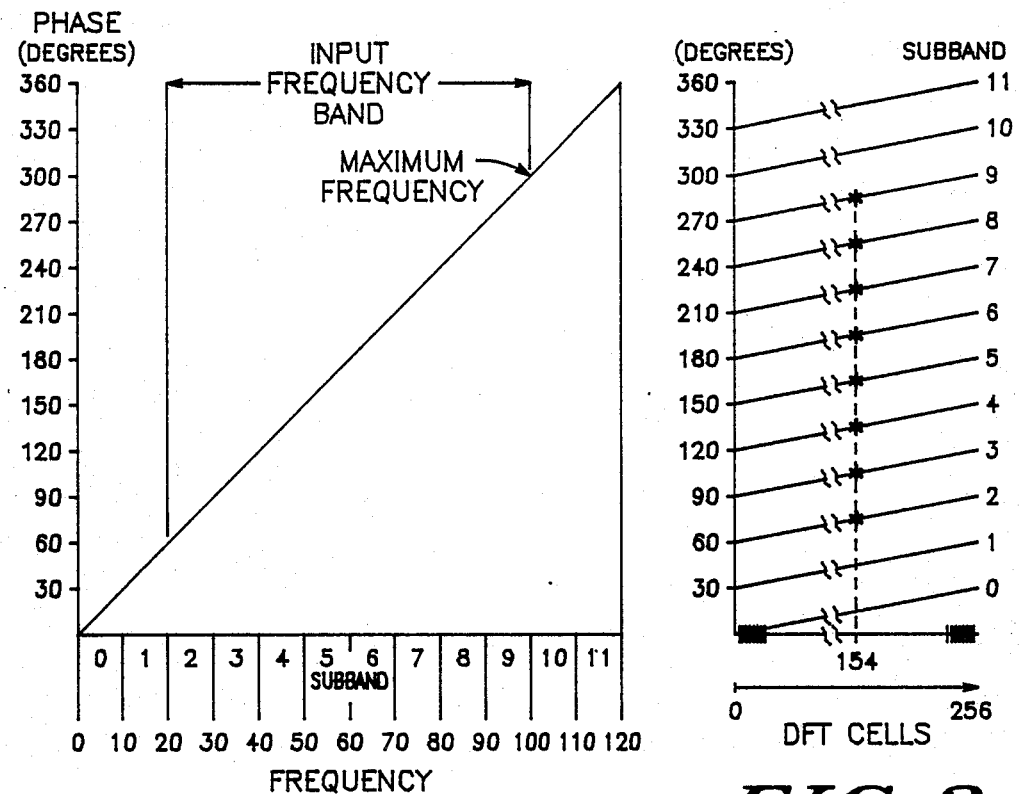
FIG. 1 shows a graph of phase versus frequency for an indeterminate input signal delayed by a predetermined period of time.

As shown in FIG. 1, the input signal may exhibit a combination of any one or more of frequencies within a predetermined input frequency band. For the preferred embodiment this input frequency band extends from 20 MHz to 100 MHz. Furthermore, each frequency component within the input frequency band may exhibit a wide range of amplitudes. A maximum frequency of the input frequency band represents that frequency which is greater than or equal to all frequencies within the input frequency band. In the preferred embodiment, this maximum frequency is 100 MHz.

The period of this maximum frequency is indirectly related to the delay between the first and second portions of the input signal. This period represents the amount of time required for the maximum frequency to undergo one complete oscillation, or 360° of phase change. In the preferred embodiment, the delay is calculated to equal one complete oscillation of a frequency which is arbitrarily chosen to be 120% of the maximum frequency. By choosing this frequency as being greater than the maximum frequency, the phase shift for each frequency component within the input frequency band remains less than 360°. Resultingly, each frequency component of the delayed input signal experiences a unique phase shift. In the preferred embodiment, the delay is approximately 8.3 ns. Consequently, delayed input signals within the input frequency band experience a phase shift which linearly increases from 60° to 300° as frequency components increase from 20 MHz to 100 MHz, respectively.

The present invention samples both the delayed portion of the input signal and the non-delayed portion of the input signal at a common sampling rate equivalent to the Nyquist rate for a single subband of the overall input frequency band. The preferred embodiment samples each of the delayed and non-delayed input signals at a rate of 20 million samples per second. This represents the Nyquist sampling rate for a 10 MHz subband. Accordingly, the delay discussed above provides a unique phase shift for signals over a range of twelve, 10 MHz subbands, as shown in FIG. 1. However, the input frequency band is defined as encompassing only eight of the twelve sub-bands, such as subbands 2 through 9.

Figure 2:
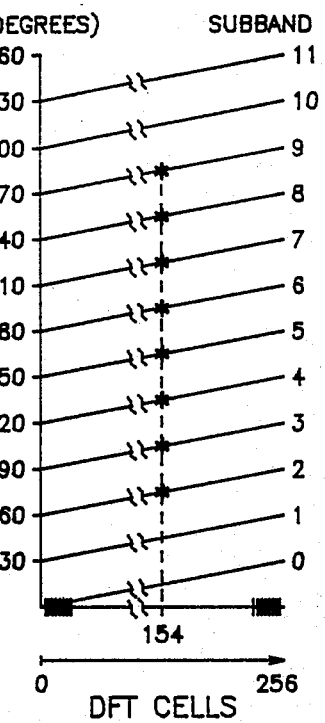
FIG. 2 shows an alias tag applied to frequency cells for a frequency domain signal output from a conventional fourier transform processor.

FIG. 2 shows an alias tag which the unique phase shift applies to frequency domain signals output from a conventional discrete fourier transform (DFT) processor. Since the preferred embodiment of the present invention samples the input signals at a rate which is less than the Nyquist rate for the overall input frequency band (see FIG. 1), aliasing results. Aliasing represents ambiguity in the transformation performed by a DFT processor. Each of the subbands are "folded" upon one another within the single subband defined by the sampling rate. In the preferred embodiment, a conventional DFT processor provides frequency domain outputs for 256 frequency cells. The alias ambiguity causes each of the 256 cells to contain information which describes subbands 0 through 11. For example, as shown at a frequency cell 154 in the preferred embodiment described in FIG. 2, input time domain signal frequency components of precisely 24, 34, 44, 54, 64, 74, 84 and 94 MHz will all be transformed into a single one of the 256 frequency cells by a DFT processor. Thus, these frequency components cannot be distinguished from one another without computations based on additional information.

Such additional information is available in the present invention in the form of the alias tag discussed above. Accordingly, the present invention resolves the phase difference between the delayed portion and the non-delayed portion of the input signal in a post-DFT operation to eliminate ambiguities caused by aliasing. The preferred embodiment of the present invention then discards any signals existing in subbands 0 through 1 or 10 through 11 as determined by the relative phase difference so that aliasing is not a problem over the input frequency band (see FIG. 1).

Figure 3:
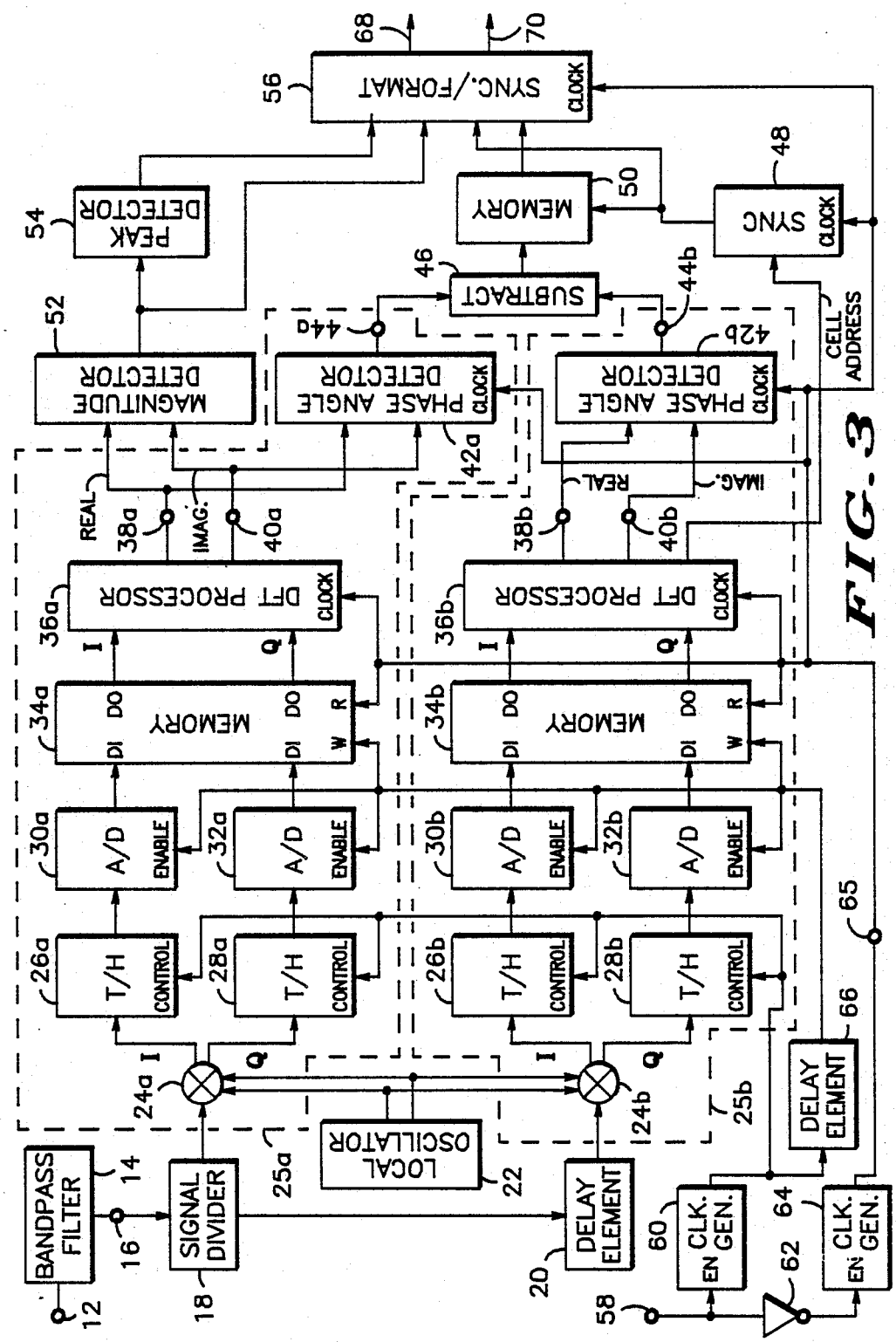
FIG. 3 shows a block diagram of a time domain to frequency domain signal converter.

FIG. 3 shows a block diagram of a time domain to frequency domain signal conversion apparatus 10. Apparatus 10 represents a portion of a DFT receiver which resolves the frequency of incoming RF signals over the entire 20 through 100 MHz input frequency band discussed above in connection with FIG. 1.

An unfiltered RF input signal is applied at a terminal 12, which connects to an input of a bandpass filter 14. Bandpass filter 14 need not proVide a sharp cutoff frequency for signals transmitted therethrough because the alias tag discussed above additionally addresses the aliasing problem. Rather, in the preferred embodiment input signals exhibiting a frequency of greater than 120% of the maximum input frequency (see FIG. 1) are attenuated to below a predetermined minimum amplitude threshold. In the preferred embodiment, bandpass filter 14 exhibits cutoff frequencies at 20 and 100 MHz so that frequency components within the input frequency band are transmitted through bandpass filter 14 without substantial attenuation. Frequency components of 120 MHz or greater are attenuated a minimum of 42 db.

A filtered input signal is provided by an output of bandpass filter 14, which couples to a terminal 16 and an input of a signal divider 18. A first output of signal divider 18 connects to a signal input of a quadrature mixer 24a and a second output of signal divider 18 connects to an input of a delay element 20. An output of delay element 20 connects to a signal input of a quadrature mixer 24b.

Signal divider 18 splits the filtered input signal into two equal power portions which exhibit substantially no phase shift relative to one another. Delay element 20 provides the delay discussed above in connection with FIGS. 1 and 2. Delay element 20 represents a coaxial delay line in the preferred embodiment which is cut so that a period of time equivalent to one complete oscillation of a 120 MHz signal results. The output from delay element 20 represents the delayed input signal. A signal output from the first output of signal divider 18 represents the non-delayed input signal.

A local oscillator 22 provides a first reference signal at an output thereof which couples to a first reference input of quadrature mixer 24a and a first reference input of quadrature mixer 24b. Local oscillator 22 additionally provides a second reference signal, which exhibits the same frequency as the first reference signal but a 90° phase shift at a second output. This second output of local oscillator 22 connects to a second reference input of quadrature mixer 24a and to a second reference input of quadrature mixer 24b. In the preferred embodiment, these reference signals output from local oscillator 22 exhibit approximately a 60 MHz frequency. Thus, mixers 24 down-convert the delayed and non-delayed input signals to base band signals having a 0 through 40 MHz frequency bandwidth. This 40 MHz base band signal represented in quadrature and in-phase channels directly corresponds to the 100 MHz RF maximum frequency input signal and represents a maximum frequency transformed by a DFT processor (discussed below). Likewise, the 20 MHz RF signal directly corresponds to the 40 MHz base band signal resulting from the quadrature down conversion.

Mixers 24a and 24b each reside at a front end, relative to signal flow within the FIG. 3 block diagram, of two identical signal processing channels. A main channel 25a includes quadrature mixer 24a, a track and hold (T/H) amplifier 26a, a T/H amplifier 28a, an analog to digital (A/D) converter 30a, an A/D converter 32a, a memory element 34a, a discrete fourier transform (DFT) processor 36a, real and imaginary frequency domain signal buses 38a and 40a, respectively, a phase angle detector 42a, and an output 44a. Likewise, an auxiliary channel 25b includes quadrature mixer 24b, a T/H amplifier 26b, a T/H amplifier 28b, an A/D converter 30b, an A/D converter 32b, a memory element 34b, a DFT processor 36b, real and imaginary frequency domain buss 38b and 40b, respectively, a phase angle detector 42b, and an output 44b. The difference between main and auxiliary channels 25 is that auxiliary channel 25b operates upon the delayed time domain input signal whereas main channel 25a operates upon the non-delayed time domain input signal.

Since main and auxiliary channels 25 are structurally identical, these channels will be described with reference to only one channel which may represent either of main or auxiliary channels 25. Thus, mixer 24 of channel 25 has an in-phase output which connects to a signal input of T/H amplifier 26, and a quadrature output which connects to a signal input of T/H amplifier 28. A signal output of T/H amplifier 26 connects to a signal input of A/D converter 30, and a signal output of T/H amplifier 28 connects to a signal input of A/D converter 32. An output of A/D converter 30 connects to a first data input of memory element 34, and an output of A/D converter 32 connects to a second data input of memory element 34. A first data output of memory element 34 connects to a first signal input of DFT processor 36, and a second data output of memory element 34 connects to a second signal input of DFT processor 36. DFT processor 36 provides a real frequency domain signal on bus 38 and an imaginary frequency domain signal on bus 40. Bus 38 connects to a first input of phase angle detector 42 and bus 40 connects to a second input of phase angle detector 42. An angle output from phase angle detector 42 connects to output 44, which represents the output of channel 25.

Apparatus 10 operates in two modes. During a sample mode, apparatus 10 collects samples and digitizes the input signal to form an input data array for DFT processors 36. During a DFT mode, apparatus 10 does not collect samples of the input signal, but performs a fourier transform on previously collected samples to produce an output data array. Accordingly, a terminal 58 receives an input signal to control the mode of operation for apparatus 10.

Terminal 58 connects to an enable input of a clock generator 60 and to an input of an inverter 62. An output of inverter 62 connects to an enable input of a clock generator 64. An output of clock generator 60 couples to an input of a delay element 66 and to control inputs of T/H amplifiers 26 and 28. An output of delay element 66 couples to enable inputs of A/D converters 30 and 32 and to a write input of memory element 34. An output of clock generator 64 connects to a terminal 65, a read input of memory element 34, and to clock inputs of DFT processor 36 and phase angle detector 42. As discussed above, connections between main and auxiliary channels 25 are identical for the clock signals produced by clock generators 60 and 64 and by delay element 66.

T/H amplifiers 26 and 28 along with A/D converters 30 and 32 sample and digitize the input base band signal. T/H amplifiers 26 and 28 acquire the base band signal in a track mode of operation for T/H amplifiers, and output signals from T/H amplifiers 26 and 28 remain stable during a hold mode of operation for T/H amplifiers. A/D converters 30 and 32 perform an analog-to-digital conversion or digitization, of the base band signal only during the hold mode of operation for T/H amplifiers 26 and 28. Thus, the stable input to A/D converters 30 and 32 from T/H amplifiers 26 and 28, respectively, improves accuracy by reducing aperture jitter of A/D converters 30 and 32.

Clock generator 60 provides the clock signal which determines the sample rate of apparatus 10. The preferred embodiment utilizes a 10 MHz clock signal to sample in-phase and quadrature signals. Thus, in-phase signals are sampled at a 10 MHz rate and quadrature signals are also sampled at a 10 MHz rate resulting in a total sampling rate of 20 MHz. This 20 MHz sampling rate represents the Nyquist rate for a single 10 MHz subband, as discussed above in connection with FIGS. 1 and 2.

Delay element 66 synchronizes the operation of A/D converters 30 and 32 with the operation of T/H amplifiers 26 and 28. Additionally, the digitized samples output from A/D converters 30 and 32 are stored as an input data array in memory element 34. The storing, or writing, of data into memory element 34 occurs synchronously with the sampling of input signals.

Memory element 34 permits DFT processor 36 to operate at a rate which is independent from the sampling rate. Thus, clock generator 64 provides a clock signal which need not be related to the 10 MHz clock signal provided by clock generator 60. The preferred embodiment stores 256 samples of the input base band signal in memory element 34 while DFT processor 36 remains idle. This represents the sample mode. After the 256 samples have been collected and stored in an input data array in memory element 34, apparatus 10 may enter the DFT mode by changing a logical state of a signal applied at terminal 58. In the DFT mode apparatus 10 refrains from collecting new samples of the base band signal. Rather, in the DFT mode, DFT processor 36 reads data from buffer memory 34 in connection with performance of a fourier transformation on the data contained on the input array. Thus, data may be read from memory element 34 synchronously with operation of DFT processor 36.

DFT processor 36 represents a conventional DFT processor known to those skilled in the art and is therefore not discussed in detail herein. The preferred embodiment of the present invention utilizes a MSI and LSI logic circuit constructed to perform a Cooley-Tuckey algorithm, also known as the Fast Fourier transform, to achieve relatively fast transformation times. However, for purposes of the present invention, the Cooley-Tuckey algorithm may be embodied in any number of implementations including a wide variety of signal processor, computer, and microprocessor implementations having appropriate software programming. Furthermore, other discrete fourier transform algorithms such as the Prime Factor Algorithm (PFA) or Winograd Fourier Transform Algorithm (WFTA) may be used in the present invention.

All such algorithms may be easily adapted by those skilled in the art to input a time domain data array, such as provided by memory element 34, and to input a clock signal, such as provided by clock generator 64. Furthermore, such algorithms may be adapted to generate a sequence of outputs as an output data array which describes amplitude components of frequencies within various frequency cells. In the preferred embodiment, the output from DFT processor 36 provides real and imaginary digital data on busses 38 and 40, respectively, for each of 256 equal bandwidth frequency cells. The outputs occur sequentially in either successively increasing or decreasing frequency cell address order. For example, DFT processor 36 may generate real and imaginary amplitude data for the highest frequency cell address first upon entry into the DFT mode of operation, followed by generation of real and imaginary amplitude data for the next highest frequency cell address. This process continue until DFT processor 36 generates real and imaginary amplitude data for the lowest frequency cell address, which in the preferred embodiment would represent the 256th frequency cell.

Phase angle detector 42 receives the sequential real and imaginary amplitude data for each frequency cell as it is being generated by DFT processor 36. Phase angle detector 42 then resolves the phase angle between the real and imaginary components of data for each frequency cell. This resolved phase angle represents an arbitrary phase of the frequency components of the time domain signal transformed by DFT processor 36. Phase angle detector 42 is described in more detail in FIG. 4 for the preferred embodiment in which real and imaginary data values presented on buses 38 and 40, respectively, contain 12 bits of information each.

Figure 4:
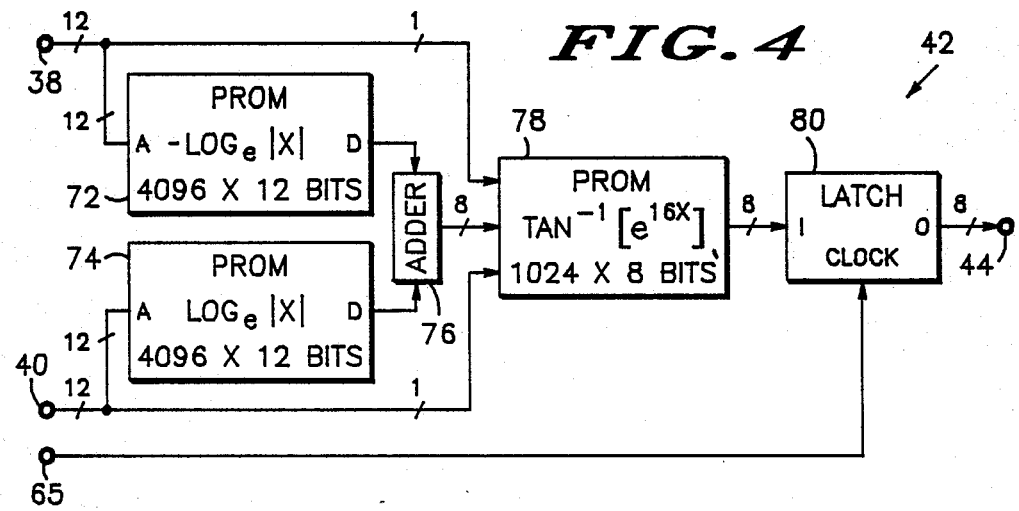
FIG. 4 shows a block diagram of a phase angle detector portion of the signal converter shown in FIG. 3.

Referring to FIG. 4, bus 38 connects to an address input of a programmable read-only memory (PROM) 72, and bus 40 connects to an address input of a PROM 74. A data output of PROM 72 connects to a first input of an adder 76 and a data output of PROM 74 connects to a second input of adder 76. An 8 bit output of adder 76 connects to a first address input of a PROM 78, a single sign bit from real frequency domain bus 38 connects to a second address input of PROM 78, and a single sign bit from imaginary bus 40 connects to a third address input of PROM 78. An 8 bit output of PROM 78 connects to a data input of a pipe-line latch 80, and an 8 bit output from latch 80 connects to output 44. Additionally, terminal 65 connects to a clock input of latch 80.

Imaginary data from bus 40 is input to PROM 74 where the imaginary data are mapped into the natural log of the absolute value of the input magnitude of the imaginary data. The real data are input to PROM 72 where the real data are mapped into (minus) the natural log of the absolute value of the input magnitude of the real data. The resulting outputs from PROMS 72 and 74 are added in adder 76 to form the difference between the two log values. The value generated by adder 76 represents the log ratio of the imaginary to the real data values. The 8 most significant bits of this log ratio are input to PROM 78. Since only 8 of the most significant bits are used, the log ratio value is mathematically divided by 16. PROM 78 maps this log ratio into the arc-tangent of "e" raised to 16 times the input word value. The factor of 16 is used to compensate for the effective division by 16 at the output of adder 76. Thus, the output of PROM 78 represents the phase angle for the frequency cell described by the real and imaginary data presented on buses 40 and 38 at any given time. This phase angle result is then latched in latch 80 so that it may remain stable while a subsequent phase angle calculation occurs.

Referring back to FIG. 3, main and auxiliary channels 25 are identical to each other through outputs 44a and 44b. Phase angle detectors 42 generate signals at outputs 44a and 44b which indicate arbitrary angles. However, due to the alias tag added to the delayed input signal processed in auxiliary channel 25b, a difference occurs between the angles indicated by the signals presented at outputs 44a and 44b.

Outputs 44a and 44b provide the output signals from the main and the auxiliary channels, respectively. These outputs are input to a subtractor 46. Subtractor 46 calculates this angle difference, which corresponds to the relative phase difference between input signals processed by main and auxiliary channels 25.

A cell address output from DFT processor 36b provides a digital number which describes a current frequency cell to which real and imaginary data on buses 38 and 40 relate. This cell address output may advantageously originate from either DFT processor 36a or DFT processor 36b since both processors operate identically. The cell address output connects to a data input of a synchronizer 48. Synchronizer 48 represents a latch circuit which causes the cell address to conform to timing requirements of apparatus 10. Accordingly, the output from synchronizer 48 also represents the cell address, but the cell address output from synchronizer 48 is delayed in time so that it may be presented to memory 50 at the same time that phase angle information output from subtractor 46 is presented to memory element 50 for the described cell address. In the preferred embodiment, only a most significant bit of the cell address output from synchronizer 48 is input to memory element 50.

Memory element 50 represents a PROM which maps the relative phase difference calculated by subtractor 46 into a specific subband number, such as the values described in FIGS. 1 and 2. The most significant cell address bit input to memory element 50 is used to resolve ambiguities in subband numbers which might otherwise exist near boundaries between the subbands. Accordingly, memory element 50 provides a digital value which corresponds to the subbands within which the time domain input signal may be classified. Additionally, memory element 50 detects when subbands are outside the input frequency band (see FIG. 1) to insure that no aliasing occurs. In the preferred embodiment, a relative phase difference of 0 to 60° indicates an input signal exhibiting a frequency component in subbands 0 through 1, which are below the input frequency band. Likewise, a relative phase difference of 300° to 360° represents an input signal exhibiting a frequency component in subbands 10 through 11, which are above the input frequency band. Accordingly, memory element 50 provides either no output or a disabled output when phase angle differences indicate subbands 0 through 1 and 10 through 11.

In the preferred embodiment, the output from memory element 50 consists of 4 bits. One bit represents an enable bit which is active for subbands 2 through 9 and inactive for subbands 0 through 1 and 10 through 11. The remaining 3 bits describe the eight allowable subbands designated as subbands 2 through 9 in FIG. 1. An output of memory element 50 and the output from synchronizer 48 connect to first and second inputs, respectively, of a synchronizer/formatter 56. Synchronizer 48 provides the cell address, which in the preferred embodiment is a number between 0 and 255. The 3 bits output from memory element 50 which describe the subband may be viewed as being more significant bits which are added or combined with the cell address to form an unambiguous frequency description which represents the entire frequency band shown in FIG. 1.

A magnitude detector 52 has real and imaginary inputs which connect to real and imaginary buses 38a and 40a output from DFT processor 36a. Magnitude detector 52 produces a digital number which represents the complex magnitude described by the real and imaginary amplitude data on real and imaginary buses 38a and 40a, respectively. This magnitude detection may be accomplished by calculating the square root of the sum of the real value squared and the imaginary value squared.

The preferred embodiment implements magnitude detector 52 using PROMS (not shown). A first PROM receives a 12 bit real value from bus 38a and a second PROM receives a 12 bit imaginary value from bus 40a. The PROMS output digital values equal to the square of the values provided at their inputs. The PROM outputs are then added together in an adder and the resulting sum is input to a third PROM which performs the square root operation. Accordingly, an output from magnitude detector 52 represents a digital value which describes the magnitude of frequency components contained within each frequency cell.

The preferred embodiment additionally includes a peak detector 54 which has an input connected to the output of magnitude detector 52. Peak detector 54 utilizes latches and comparators configured in a manner achievable by those skilled in the art to monitor the slope of the magnitude values produced by magnitude detector 52. As magnitudes increase with changes in cell addresses, peaks are assumed not to have yet occurred. However, as soon as magnitudes begin decreasing with increasing cell addresses, the peak is assumed to have passed. Thus, when the slope of the magnitude changes from a positive value to a negative value, a peak is assumed to have been detected. The output from peak detector 54 represents an enable signal which identifies a particular cell address and a particular magnitude value as being a peak value.

The output from magnitude detector 52 connects to a third input of synchronizer/formatter 56, and the output of peak detector 54 connects to a fourth input of synchronizer/formatter 56. Synchronizer/formatter 56 delays one or more of the cell address, subband number from memory 50, magnitude detector value, or peak detector output signal so that these outputs conform to timing requirements of apparatus 10 and occur at a common point in time in the outputs from synchronizer/formatter 56. Consequently, an output 68 from synchronizer/formatter 56 provides frequency data in the form of a combined subband number and cell address. An output 70 from synchronizer/formatter 56 provides magnitude data in a format required by the remainder of a system in which apparatus 10 operates (not shown). At any given point in time the magnitude data at output 70 reflects the frequency described by data presented at output 68. It is the outputs 68 and 70 from synchronizer/formatter 56 which represent the frequency domain output signal from apparatus 10.

An alternative embodiment (not shown) utilizes the same structure as that described above to increase frequency cell resolution rather than to increase bandwidth. In this alternative embodiment, the delayed portion of the input signal is delayed only one complete oscillation of a frequency cell width. For example, 256 samples at a 20 million samples per second input data sampling rate causes a conventional DFT processor to produce on output data array having 256 frequency cells over a 10 MHz bandwidth. Accordingly, the delayed input signal is delayed 1/10 MHz/256 (0.39 ns).

In this alternative embodiment, the post DFT subtraction operation determines the phase difference between frequency domain signals from non-delayed and delayed input signals. In a manner similar to that described above, this phase difference allows the post DFT operation to determine specific frequencies within frequency cells to a precision that corresponds to the precision achievable in detecting the phase difference.

In summary, the present invention represents a time domain to frequency domain signal converter which permits sampling below the Nyquist rate for the input frequency band. The preferred embodiment of the present invention uses a 10 MHz sample signal to operate over a 20 to 100 MHz input frequency band, which could otherwise require a minimum Nyquist sampling rate of 200 MHz using a single conventional DFT processor. Additionally, the present invention represents a time domain to frequency domain signal converter that utilizes conventional DFT processors and which expands an input signal frequency band over that possible at the given sampling rate. The preferred embodiment samples at the rate of 20 million samples per second. This represents a Nyquist rate for a 10 MHz frequency band. However, the overall system input frequency band extends from 20 MHz to 100 MHz. This is an 8 to 1 improvement in input frequency bandwidth.

The present invention is described above with reference to a particular embodiment which facilitates teaching the invention. Those skilled in the art will recognize that many alternative embodiments also fall within the scope of the present invention. For example, although the preferred embodiment utilizes separate and identical DFT processors 36 for the main and auxiliary channel, those skilled in the art will recognize that component savings may be achieved by utilizing a common controller for the two DFT processors. Additionally, those skilled in the art will recognize that various portions of the main and auxiliary channels can be multiplexed to utilize only one multiplexed channel if system throughput constraints permit. Still further, the specific preferred embodiment parameters described herein such as number of frequency cells produced by DFT processors 36, frequencies, frequency bands, and the like, are not critical parameters and may vary without departing from the scope of the present invention. These and other changes and modifications to the above-described preferred embodiment which are obvious to those skilled in the art are intended to be included within the scope of the present invention.

I claim:

1. A time domain to frequency domain signal converter comprising:
    a terminal for receiving an input signal capable of exhibiting one of a plurality of frequencies;
    means for performing a first fourier transform, said first fourier transform performing means having an input coupled to said terminal and having an output of providing a first signal corresponding to a particular one of the plurality of frequencies of said input signal;
    means, having an input coupled to said terminal and having an output, for delaying the input signal;
    means for performing a second fourier transform, said second fourier transform performing means having an input coupled to the output of said delaying means and having an output for providing a second signal corresponding to a particular one of the plurality of frequencies of said delayed input signal;
    means, having an input coupled to the output of said first fourier transform performing means and having an output, for calculating signal phase of the first signal;
    means, having an input coupled to the output of said second fourier transform performing means and having an output for calculating signal phase of the second signal;
    means, coupled to the outputs of said means for calculating signal phase of the first and second signal, for calculating a phase difference between the first and second signals;
    each of the plurality of frequencies of the input and the delayed input signals is not greater than a maximum one of the plurality of frequencies, the maximum one of the plurality of frequencies corresponds to a maximum frequency transformed by said first and second fourier transform performing means;
    first means, having an input coupled to said terminal and having an output coupled to the input of said first fourier transform performing means, for sampling the input signal at a predetermined sample rate so that fewer than two samples for each complete oscillation of the maximum transformed frequency occur;
    second means, having a delay input coupled to the output of said delaying means and having an output coupled to the input of said second fourier transform performing means, for sampling the input signal at the predetermined sample rate; and
    band pass filter means having an output coupled to said terminal, said band pass filter means being configured so that said band pass filter means transmits, with low level attenuation, frequencies of the input signal which correspond to frequencies transformed by said first and second fourier transform performing means that exhibit more than one complete oscillation for each two samples at the predetermined sample rate.

2. A signal converter as claimed in claim 1 wherein the plurality of frequencies each exhibit a frequency value which is not greater than a maximum one of the plurality of frequencies, and said means for delaying is configured to delay the input signal a period of time which is less than one complete oscillation of the maximum one of the plurality of frequencies.

3. A signal converter as claimed in claim 1 additionally comprising:
    a band pass filter having an input adapted to receive an unfiltered input signal and having an output coupled to said terminal for providing the input signal;
    a signal divider having an input coupled to said terminal, a first output coupled to the input of said first fourier transform performing means, and a second output coupled to the input of said delaying means.

4. A signal converter as claimed in claim 3 additionally comprising:
    a first quadrature mixer having a signal input coupled to the first output of said signal divider, an in-phase output, and a quadrature output;
    a first means having in-phase and quadrature inputs coupled to the in-phase and quadrature outputs, respectively, of said first quadrature mixer and having in-phase and quadrature outputs coupled to the input of said first fourier transform performing means, for sampling the input signal;
    a second quadrature mixer having a signal input coupled to the output of said delaying means, an in-phase output a quadrature output; and
    a second means having in-phase and quadrature inputs coupled to the in-phase and quadrature outputs, respectively, of said second quadrature mixer and having in-phase and quadrature outputs coupled to the input of said second fourier transform performing means, for sampling the input signal.

5. A signal converter as claimed in claim 1 wherein said phase difference calculating means comprises a subtractor.

6. A signal converter as claimed in claim 1, said means for calculating signal phase of the first signal including:
    first means for mapping connected to said first fourier transform performing means and being operated to produce the natural log of the absolute value of said first signal;
    second means for mapping connected to said first fourier transform performing means and begin operated to produce minus natural log of the absolute value of the first signal;
    adder means connected to said first and second means for mapping and operating to produce a logarithmic ratio of said natural log and said minus natural log of said first and second means for mapping; and third mapping means connected to said adder means and to said first fourier transform performing means, said third mapping means providing an arc-tangent function for producing a phase angle of said first signal.

7. A signal converter as claimed in claim 1, said means for calculating signal phase of the second signal including:

first means for mapping connected to said second fourier transform performing means and being operated to produce the natural log of the absolute value of said second signal;

second means for mapping connected to said second fourier transform performing means and being operated to produce minus natural log of the absolute value of the second signal;

adder means connected to said first and second mapping means and operating to produce a logarithmic ratio of said natural log and said minus natural log of said first and second mapping means; and third mapping means connected to said adder means and to said second fourier transform performing means, said third mapping means providing an arc-tangent function for producing a phase angle of said second signal.

8. A method of converting a time domain input signal capable of exhibiting one of a plurality of frequencies into a frequency domain output signal, the method comprising the steps of:

delaying the input signal by a constant predetermined period of time to produce a delayed input signal;

performing a first fourier transform operation on the input signal to produce a first frequency domain signal which corresponds to a particular one of the plurality of frequencies of said input signal;

performing a second fourier transform operation on the delayed input signal from said delaying step to produce a second frequency domain signal which corresponds to a particular one of the plurality of frequencies of said delayed input signal;

calculating a phase difference between the first and second frequency domain signals;

the plurality of frequencies of said input and delayed input signals each exhibit a frequency value which is not greater than a maximum one of the plurality of frequencies, the maximum one of the plurality of frequencies corresponds to a maximum frequency transformed by said first and second fourier transform performing steps;

sampling the input signal at a predetermined sample rate wherein fewer than two samples for each complete oscillation of the maximum transformed frequency occur;

sampling the delayed input signal at the predetermined sample rate; and bandpass filtering the input signal so that frequencies of the input signal which correspond to frequencies transformed by said first and second fourier transform performing steps and which exhibit more than one complete oscillation for each two samples at the predetermined sample rate are attenuated at a low-level by said filtering step.

9. A method as claimed in claim 8 additionally comprising the step of combining a subband frequency which corresponds to the difference of said calculating step to one of the first and second frequency domain signals to obtain the frequency domain output signal.

10. A method as claimed in claim 8 wherein:

the plurality of frequencies each exhibit a frequency value which is not greater than a maximum one of the plurality of frequencies; and said delaying step comprises the step of configuring a delay element so that the constant predetermined period of time by which the input signal is delayed is less than one complete oscillation of the maximum one of the plurality of frequencies.

11. An apparatus for converting a time domain input signal capable of exhibiting an indeterminate one of a plurality of frequencies each of which is not greater than a maximum one of the plurality of frequencies into a frequency domain output signal which corresponds to the indeterminate one of the plurality of frequencies, the apparatus comprising:

a band pass filter having an input adapted to receive the input signal and having an output;

a delay element having an input coupled to the output of said band pass filter and having an output, said delay element being configured to delay the filtered input signal a period of time which is less than one complete oscillation of the maximum one of the plurality of frequencies;

first means, having an input coupled to the output of said filter and having an output, for sampling the input signal at a predetermined sample rate wherein fewer than two samples for each complete oscillation of the maximum one of the plurality of frequencies occur;

second means, having an input coupled to the output of said delay element and having an output, for sampling at the predetermined sample rate;

means for performing a first fourier transform, said first fourier transform performing means having an input coupled to the output of said first sampling means and having an output for providing a first frequency domain signal corresponding to the indeterminate one of the plurality of frequencies;

means for performing a second fourier transform, said second fourier transform performing means having an input coupled to the output of said second sampling means and having an output for providing a second frequency domain signal corresponding to the indeterminate one of the plurality of frequencies; and means, coupled to the output of said first fourier transform performing means and to the output of said second fourier transform performing means, for calculating a phase difference between the first and second frequency domain signals.

* * * * *

UNITED STATES PATENT AND TRADEMARK OFFICE
CERTIFICATE OF CORRECTION

PATENT NO. : 4,893,266

DATED : January 9, 1990

INVENTOR(S) : Jake O. Deem

It is certified that error appears in the above-identified patent and that said Letters Patent is hereby corrected as shown below:

In column 12, claim 6, line 64, delete the word "begin" and substitute --being--.

Signed and Sealed this

Twenty-first Day of May, 1991

*Attest:*

HARRY F. MANBECK, JR.

*Attesting Officer*   *Commissioner of Patents and Trademarks*